(12) United States Patent
Bragg et al.

(10) Patent No.: US 11,509,406 B2
(45) Date of Patent: Nov. 22, 2022

(54) ANTENNA ASSEMBLY DETECTION BASED ON OSCILLATOR AND VARIABLE REACTANCE TANK CIRCUIT

(71) Applicant: Neptune Technology Group Inc., Tallassee, AL (US)

(72) Inventors: Steven Donald Bragg, Tallassee, AL (US); William Anthony Nolan, Milbrook, AL (US)

(73) Assignee: Neptune Technology Group Inc., Tallassee, AL (US)

( * ) Notice: Subject to any disclaimer, the term of this patent is extended or adjusted under 35 U.S.C. 154(b) by 209 days.

(21) Appl. No.: 16/832,421

(22) Filed: Mar. 27, 2020

(65) Prior Publication Data

US 2020/0313777 A1 Oct. 1, 2020

Related U.S. Application Data

(60) Provisional application No. 62/835,669, filed on Apr. 18, 2019, provisional application No. 62/828,105, filed on Apr. 2, 2019, provisional application No. 62/825,885, filed on Mar. 29, 2019.

(51) Int. Cl.

| | |
|---|---|
| *H04B 17/20* | (2015.01) |
| *H01Q 1/50* | (2006.01) |
| *H04B 17/00* | (2015.01) |
| *H03F 3/20* | (2006.01) |
| *H04B 1/04* | (2006.01) |

(Continued)

(52) U.S. Cl.
CPC .............. *H04B 17/20* (2015.01); *H01Q 1/50* (2013.01); *H03F 3/20* (2013.01); *H04B 1/0458* (2013.01); *H04B 1/18* (2013.01); *H04B 7/0608* (2013.01); *H04B 17/00* (2013.01); *H03F 2200/451* (2013.01); *H04B 2001/0408* (2013.01)

(58) Field of Classification Search
CPC ...................................................... H04B 17/20
See application file for complete search history.

(56) References Cited

U.S. PATENT DOCUMENTS

| | | | |
|---|---|---|---|
| 5,038,112 A | * | 8/1991 | O'Neill ............... H03G 3/3047 330/207 P |
| 5,471,146 A | | 11/1995 | Krayeski et al. |
| 5,493,650 A | | 2/1996 | Reinke et al. |

(Continued)

FOREIGN PATENT DOCUMENTS

| | | |
|---|---|---|
| CN | 101217303 A | 7/2008 |
| CN | 101299644 B | 11/2008 |

(Continued)

*Primary Examiner* — Hsinchun Liao
(74) *Attorney, Agent, or Firm* — Snyder, Clark, Lesch & Chung, LLP

(57) ABSTRACT

A device, a method, and a non-transitory storage medium are described in which an antenna assembly detection service is provided. A device may include an oscillator circuit whose frequency of operation is determined by a resonant frequency of a tank circuit and reactance of a load associated with the antenna terminal configured to receive an external antenna. A controller may be configured to measure an output signal of the oscillator circuit when the oscillator circuit is connected to the antenna terminal, and determine whether or not the external antenna is connected to the antenna terminal based on the measurement and comparison data.

20 Claims, 5 Drawing Sheets

(51) Int. Cl.
*H04B 1/18* (2006.01)
*H04B 7/06* (2006.01)

(56) References Cited

U.S. PATENT DOCUMENTS

| | | | |
|---|---|---|---|
| 5,568,610 A | | 10/1996 | Brown |
| 6,594,508 B1 | * | 7/2003 | Ketonen ............... G01R 29/10 |
| | | | 455/422.1 |
| 6,741,640 B1 | | 5/2004 | Johnson |
| 6,931,234 B1 | | 8/2005 | Higashi |
| 7,773,956 B2 | | 8/2010 | Fukamachi et al. |
| 8,174,364 B2 | | 5/2012 | Pedigo |
| 8,515,496 B2 | | 8/2013 | Cheng et al. |
| 9,368,008 B2 | | 6/2016 | Jefferies et al. |
| 9,680,219 B2 | | 6/2017 | Filipovic et al. |
| 9,762,039 B2 | | 9/2017 | Barker et al. |
| 10,129,003 B2 | | 11/2018 | Abdelmonem et al. |
| 2005/0271161 A1 | * | 12/2005 | Staszewski ............ H03F 1/32 |
| | | | 375/297 |
| 2006/0125508 A1 | * | 6/2006 | Glidden, III ....... G01R 31/3025 |
| | | | 340/653 |
| 2007/0046549 A1 | * | 3/2007 | Finn ...................... H01Q 1/00 |
| | | | 343/702 |
| 2008/0233890 A1 | * | 9/2008 | Baker .................... H03L 7/085 |
| | | | 455/73 |
| 2009/0160784 A1 | | 6/2009 | Ishida |
| 2013/0210477 A1 | | 8/2013 | Peter |
| 2018/0115197 A1 | | 4/2018 | Li et al. |
| 2018/0317160 A1 | | 11/2018 | Jacops et al. |
| 2018/0329003 A1 | * | 11/2018 | Nistler ............... G01R 33/3657 |

FOREIGN PATENT DOCUMENTS

| | | |
|---|---|---|
| CN | 102882547 A | 1/2013 |
| CN | 104244291 A | 12/2014 |
| CN | 106788575 A | 5/2017 |
| CN | 107592378 A | 1/2018 |
| JP | 2005-311536 A | 11/2005 |
| WO | 2018/067612 A2 | 4/2018 |
| WO | 2018/191129 A1 | 10/2018 |

* cited by examiner

US 11,509,406 B2

ANTENNA ASSEMBLY DETECTION BASED ON OSCILLATOR AND VARIABLE REACTANCE TANK CIRCUIT

CROSS-REFERENCE TO RELATED APPLICATIONS

This patent application claims priority under 35 U.S.C. § 119, based on U.S. Provisional Application No. 62/825,885, filed Mar. 29, 2019; U.S. Provisional Application No. 62/828,105, filed Apr. 2, 2019; and U.S. Provisional Application No. 62/835,669, filed Apr. 18, 2019; the disclosures of which are hereby incorporated by reference herein.

BACKGROUND

Utility companies and other entities operate distribution systems for various resources (e.g., water, gas, electricity, chemicals, etc.) to deliver these resources to customers connected to the distribution systems. A meter may be used at each point the resource is removed and/or provided from the distribution system to a customer to measure usage. Each meter includes or is coupled to a radio transmitter that has an integral or external antenna. Many metering systems use wireless communications to report meter readings to a backend system via a communication network.

DETAILED DESCRIPTION OF PREFERRED EMBODIMENTS

Figure 1:
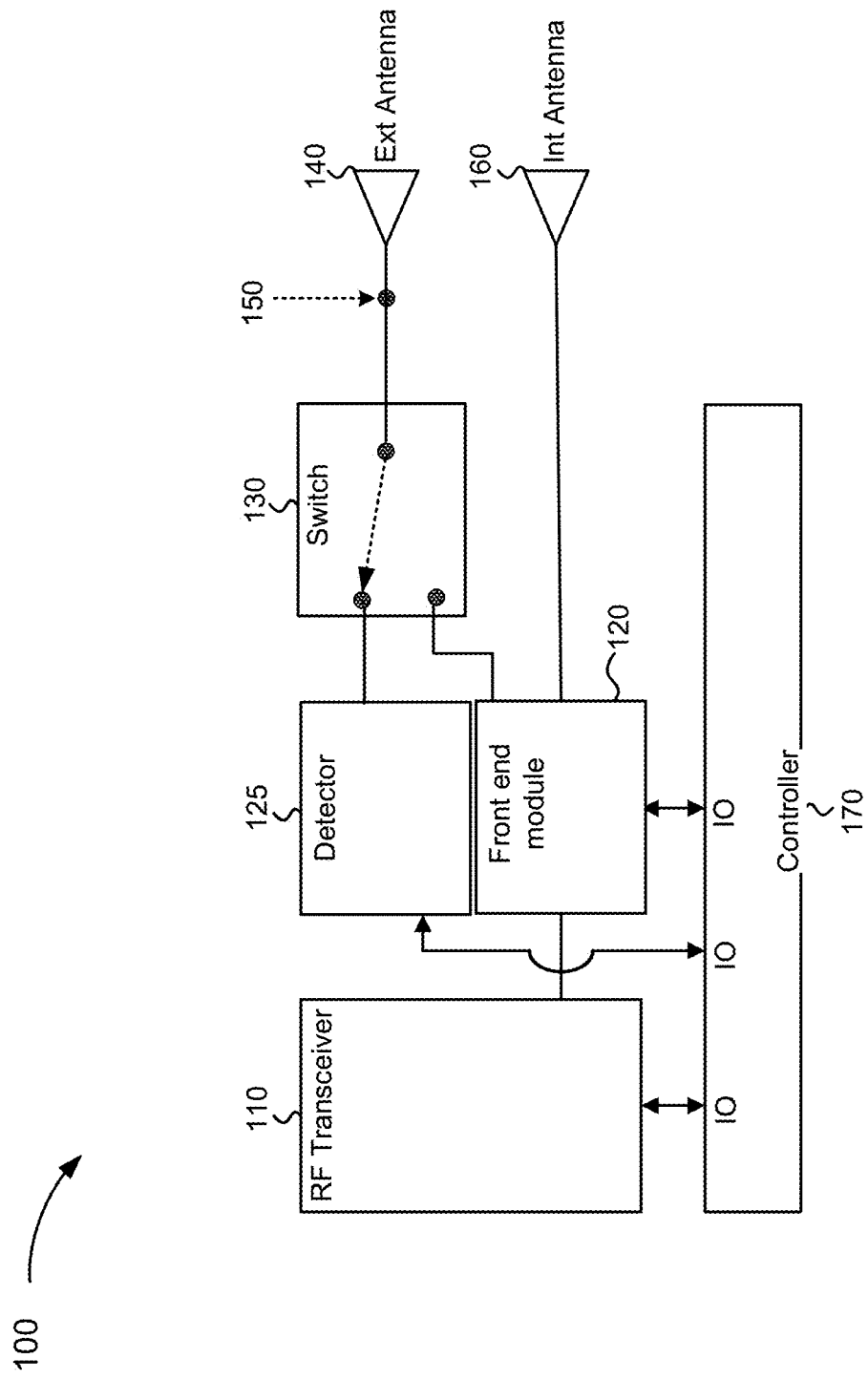
FIG. 1 is a diagram illustrating an exemplary environment in which an exemplary embodiment of an antenna assembly detection service may be implemented.

The following detailed description refers to the accompanying drawings. The same reference numbers in different drawings may identify the same or similar elements. Also, the following detailed description does not limit the invention.

Meters that measure usage of a resource, such as a utility resource (e.g., water, gas, electricity, etc.) or another type of resource (e.g., chemical, etc.) are widely used. Further, meters have been combined with electronic components to facilitate communication between the meters and backend systems via a network. For example, a meter interface unit (MIU) may include a transmitter that is configured to wirelessly transmit usage information and other information (e.g., leak information, reverse flow detection, etc.). The MIU may also include a receiver that is configured to wirelessly receive information and commands. The meter and the MIU may be a part of an automated meter reading (AMR) system, such as an AMR system associated with a water utility company, an advanced metering system (AMS), an advanced meter infrastructure (AMI), or another type of architecture associated with a utility company or another entity.

For utility meter radio transceivers that have an antenna port (e.g., a jack, a female port, etc.) for an external antenna, a controller or a processor of the transceiver may determine whether the external antenna is connected to the antenna port or not. Unfortunately, the controller can command the transmitter to transmit without regard to whether the antenna port is being used or not. This circumstance can lead to wasteful use of battery life of the meter and/or radio transmitter when the external antenna is not connected to the antenna port.

According to exemplary embodiments, an antenna assembly detection service is described. According to an exemplary embodiment, the antenna assembly detection service determines whether an antenna or antenna and an intermediary connector (e.g., a cable, a wire, etc.) (referred to herein as an antenna assembly) is connected to a utility meter radio transmitter via an antenna port. For example, the antenna assembly detection service may determine whether an antenna or a connector communicatively coupled to the antenna is plugged into the antenna port. According to an exemplary embodiment, the antenna assembly detection service determines whether the antenna assembly is connected to the radio transmitter based on an effect of a reactance of the antenna assembly on an operating frequency of an oscillator of a detection circuit. According to an exemplary embodiment, the antenna assembly detection service determines whether to transmit via the antenna assembly based on determining the connective state.

According to an exemplary embodiment, the antenna assembly detection service uses an electronic switch that may connect a port or a jack (referred to herein simply as a "jack") to a transmitter or a transceiver (referred to herein simply as a "transmitter"), or to a detector. According to other exemplary embodiments, the antenna assembly detection service uses an electronic switch that may connect the jack to a transmitter and to an oscillator circuit at the same time.

According to an exemplary embodiment, the detector includes an oscillator circuit whose frequency of operation is determined by a resonant frequency of a tank circuit. According to an exemplary embodiment, the detector may be powered only when the state of the jack (e.g., connected or not connected to the antenna assembly) is being determined. The oscillator circuit may be implemented according to various configurations. For example, the oscillator circuit may be an Inductance Capacitance (LC) oscillator or another type of linear non-LC oscillator, as described herein. According to various exemplary embodiments, the frequency of the oscillator circuit may or may not operate in the same frequency range as the resonant frequency of an (expected) antenna assembly load.

As a result, the antenna assembly detection service may significantly improve communication of data (e.g., meter usage data, etc.) to/from the MIU and minimize waste of resources (e.g., battery, transceiver circuitry, etc.). Additionally, other detection approaches may use components that can degrade in their performance and become unreliable, or are cost prohibitive. In contrast, the antenna assembly detection service may be implemented with use of no moving parts or other elements (e.g., contacts, etc.) that may be subject to corrosion, and at a cost that is not prohibitive.

FIG. 1 is a block diagram of an exemplary wireless device 100 that provides an exemplary embodiment of the antenna assembly detection service. As illustrated, wireless device 100 may include a radio frequency (RF) transceiver 110, a front-end module (FEM) 120, a detector 125, a switch 130, an external antenna 140, an external antenna RF connector terminal 150, an internal antenna 160, and a controller 170.

Wireless device 100 may include any type of device that communicates using wireless mechanisms (e.g., via radio frequencies). For example, wireless device 100 may be part of, or couple/connect to, a meter or meter interface unit (MIU). The meter may include a device that is configured to measure usage of a resource. For example, the meter may be a water meter or another type of utility meter (e.g., a gas meter, an electric meter, a chemical meter, etc.). Depending on the meter, the meter may use different measurement technologies (e.g., ultrasonic sensing, magnetic-driven, positive displacement, etc.) to measure usage of the particular resource, such as water, and so forth. The MIU may include an electronic device that collects, analyzes, and stores data from the meter. According to one exemplary implementation, the MIU may be integrated into the meter. According to another exemplary implementation, the MIU (or a portion thereof) may be a separate component from the meter. For example, the separate component may be communicatively coupled to the meter (or a remaining portion of the MIU) via a cable or another type of connector (e.g., a wireless connection). According to an exemplary implementation, the MIU may include a wireless transmitter and a wireless receiver for communication. The MIU may be configured to access and use multiple wireless access networks. According to some exemplary embodiments, one or multiple components of wireless device 100 may be included in the MIU. For example, the MIU may include RF transceiver 110, FEM 120, detector 125, switch 130, external antenna RF connector terminal 150, internal antenna 160, and controller 170. According to other examples, the MIU may include a different set of the components, as described herein.

If wireless device 100 is part of a utility meter or MIU, wireless device 100 may transmit consumption data (e.g., water, electricity, etc.) or meter/MIU status information to a backend system of a utility company or another party, and may additionally transmit data indicating the presence/absence of an external antenna assembly (e.g., external antenna 140) of the meter/MIU and/or data associated with an assessment of the external antenna assembly of the meter/MIU.

RF transceiver 110 includes a receiver that receives RF signals and a transmitter that transmits RF signals via external antenna 140, internal antenna 160, or both. RF transceiver 110 may include other components, such as for example, an amplifier, a mixer, an analog-to-digital converter (ADC), a filter, an oscillator, a digital-to-analog converter (DAC), a buffer, or another type of element that may be used for RF communication.

FEM 120 may include various components pertaining to RF reception and transmission of signals. For example, FEM 120 may include an amplifier, a mixer, a filter, an impedance matching circuit, a radio frequency switch circuit, and/or another type of element that may be used for RF communication. According to some exemplary implementations, RF transceiver 110 and FEM 120 may correspond to a radio communication interface.

Detector 125 includes logic that provides an antenna assembly detection service, as described herein. According to an exemplary embodiment, detector 125 includes an LC oscillator. For example, the LC oscillator may be a Colpitts oscillator, a Clapp oscillator, a Hartley oscillator, an Armstrong oscillator, or another type of LC-based resonant oscillator. According to another exemplary embodiment, detector 125 includes a non-LC oscillator. For example, the non-LC oscillator may be a crystal oscillator, a dielectric resonant oscillator (DRO), or another type of resonant oscillator. For purposes of description, the LC oscillator and/or the non-LC oscillator is referred to herein as an oscillator circuit.

According to various exemplary embodiments, the oscillator circuit may or may not operate in the same frequency range as a resonant frequency of an expected antenna assembly load associated with external antenna 140. According to an exemplary embodiment, the oscillator circuit is configured to oscillate based on a resonant frequency of its tank circuit, and the reactance of the antenna assembly (if connected). The oscillator circuit may oscillate at different frequencies depending on the configuration of external antenna 140, as described herein. For example, external antenna 140 may include a connector (e.g., a wire, a cable, etc.) or not, the connector may vary in length and/or composition, the antenna may be of different configurations, and so forth. As described further below, the output of detector 125 may be measured and used to detect whether or not external antenna 140 is connected, as well as other conditions, as described herein.

Switch 130 may be an electronic switch. According an exemplary embodiment, as illustrated in FIG. 1, switch 130 may be a discrete switch. However, according to other exemplary embodiments, switch 130 may be a non-discrete switch. For example, switch 130 may be included in FEM 120 or another component (e.g., a transmitter chipset that has a spare switch port, etc.) of wireless device 100. According to an exemplary embodiment, switch 130 may selectively switch between FEM 120 and detector 125, which in turn connects FEM 120 or detector 125 to external antenna 140 via external antenna RF a connector terminal 150. According to another exemplary embodiment, switch 130 may allow a transmitter/transceiver and detector 125 to be connected to external antenna 140 via external antenna RF a connector terminal 150 at the same time. This may be the case when the state of the transmitter/transceiver does not affect the operation of detector 125.

External antenna 140 connects to FEM 120 via external antenna RF connector terminal 150 and switch 130. External antenna 140 may be connected to or disconnected from wireless device 100 via external antenna RF connector terminal 150. External antenna 140 includes an antenna assembly, as described herein. For example, external antenna 140 may include an antenna or an antenna and a cable, wire, etc., as previously described. According to various exemplary embodiments, external antenna 140 may include various types or configurations of an antenna (e.g., a dipole antenna, a low-profile antenna, a multi-band antenna, or another type of antenna that may be used for RF communication). According to various exemplary embodiments, external antenna 140 (and other components of wireless device 100) may support various types of wireless networks and communications, such as, for example, a Long Range wide area network (LoRaWAN), a Sigfox low-power WAN (LPWAN), an Ingenu machine network, an Evolved UMTS Terrestrial Radio Access Network (E-UTRAN) (e.g., a Fourth Generation radio access network (4G RAN)), a 4.5G RAN, a next generation RAN (e.g., a 5G-access network), a public land mobile network (PLMN), a Worldwide Interoperability for Microwave Access (WiMAX) network, a mobile transceiver network (e.g., a mobile or handheld user device (e.g., operated by a user or a technician associated with a utility company, such as a water company), a vehicle mounted device, or another suitable mobile device (e.g., a drone, etc.)), a proprietary wireless network (e.g., owned and operated by a utility company (e.g., a water utility company, etc.), a wireless network that supports an AMR, system, an AMI system, an AMS, etc.), a WiFi network, and/or other types of wireless networks (e.g., Bluetooth, etc.).

External antenna RF connector terminal 150 may include a jack (or other type of port) configured to connect to external antenna 140. Internal antenna 160 may connect to FEM 120 and may be located internally (i.e., within the housing holding the components of the wireless device 100). Internal antenna 160 may include any type of antenna for receiving and transmitting RF signals.

Controller 170 may include one or multiple processors, microprocessors, or microcontrollers that interpret and execute instructions, and/or may include logic circuitry (e.g., a field-programmable gate array (FPGA), an application specific integrated circuit (ASIC), etc.) that executes one or more processes/functions. Controller 170 may include ports for receiving and sending data, including sending control instructions and receiving control acknowledgements, from the components of wireless device 100, such as RF transceiver 110, and FEM 120, and/or detector 125. Although not illustrated, controller 170 may also communicate with switch 130.

According to an exemplary embodiment, controller 170 includes logic that provides an antenna assembly detection service, as described herein. According to an exemplary embodiment, controller 170 measures an output frequency of detector 125, which is dependent on the reactance of the load. For example, a microcontroller may include a built-in timer and/or counter circuit. According to other examples, controller 170 may include a discrete frequency counting circuit, a downconverter, a frequency discriminator, a frequency-to-voltage converter coupled to an A/D converter, or another suitable component that can measure the frequency of the oscillator circuit with sufficient precision and/or accuracy. According to an exemplary implementation, frequency measurement may be performed by a binary up-counter, which may be clocked by a variable-frequency oscillator that counts from a default value (e.g., zero). A time based generator may stop the counter after a known period, or captures a value while running, to that the counter value accumulated during a gate interval may be read. The number of oscillator cycles during a known gate time may represent the frequency of the oscillator. In some instances, a units scaling factor may be applied to the number of oscillator cycles to produce a frequency value in Hertz.

According to an exemplary embodiment, controller 170 may store a database or other data repository structure that stores frequency detection information that correlates a frequency or frequency ranges with different external antennas 140 (when connected), when external antenna 140 is not connected, and other types of conditions, as described herein. Controller 170 may perform a lookup, based on a measured output frequency of detector 125, to determine a state of wireless device 100 relative to external antenna 140. For example, controller 170 may compare and attempt to match the measured output frequency to expected frequency values associated with different external antennas 140, etc.

According to an exemplary embodiment, controller 170 includes logic that can distinguish between different external antennas 140, when connected, based on correlated frequencies output by detector 125. According to an exemplary embodiment, controller 170 includes logic that can determine when external antenna 140 is not connected and/or another type of condition (e.g., a damaged cable, a damaged antenna, partially connected, an open cable with no antenna connected, etc.) pertaining to external antenna 140 based on correlated frequencies output by detector 125. In turn, controller 170 may determine whether to transmit via external antenna based on the identified state of wireless device 100.

According to an exemplary embodiment, controller 170 may execute software. As an example, the software may include instructions that, when executed by controller 170, provide functions of the antenna assembly detection service, as described herein. The software may also include firmware, middleware, microcode, hardware description language (HDL), and/or another form of instructions. The software may further include an operating system (OS).

Although FIG. 1 illustrates an exemplary embodiment of wireless device 100 that provides the antenna assembly detection service, according to other exemplary embodiments, wireless device 100 may include additional, fewer, and/or different components. For example, wireless device 100 may not include internal antenna 160. Additionally, for example, multiple components that are illustrated as discrete may be included into a single component. The connections between components depicted in FIG. 1 are exemplary. Additionally, for example, the number of each component illustrated is exemplary. For example, wireless device 100 may include multiple RF transceivers 110 and front end modules 120 to accommodate multiple standards or forms of RF communication (e.g., 4G, 5G, LoRaWan, proprietary, etc.). Although not illustrated, wireless device 100 includes a power source. For example, the power source may include a battery or another suitable source for electrical current, such as a local power grid, a local generator (e.g., a photoelectric generator, etc.), and so forth.

Figure 2:
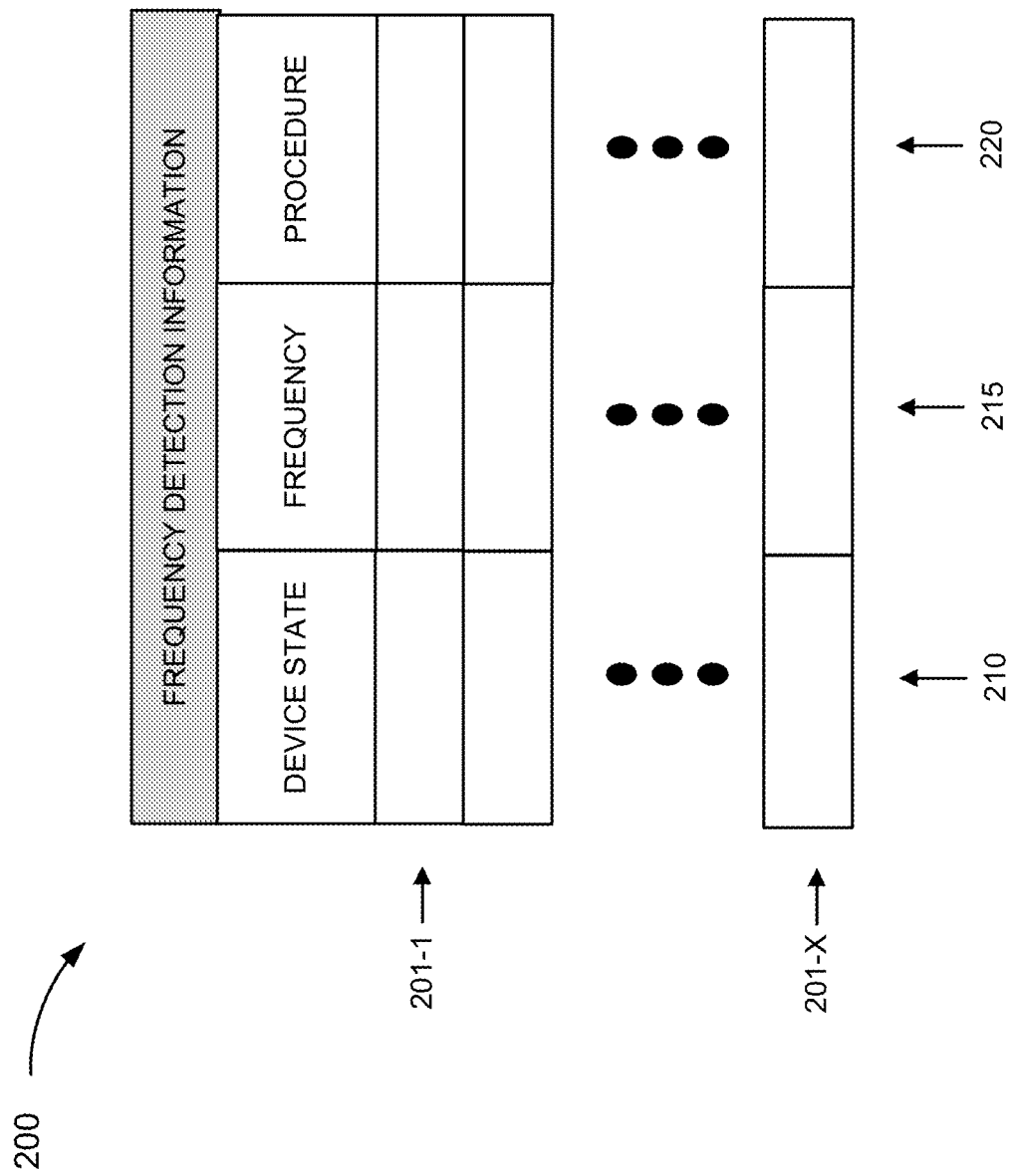
FIG. 2 is a diagram illustrating exemplary frequency detection information that may be used by an exemplary embodiment of the antenna assembly detection service.

FIG. 2 is a diagram illustrating exemplary frequency detection information that may be stored in a table 200 by wireless device 100 (e.g., in a memory). As illustrated, table 200 may include a device state field 210, a frequency field 215, and a procedure field 220. As further illustrated, table 200 includes entries 201-1 through 201-X (also referred as entries 201, or individually or generally as entry 201) that each includes a grouping of fields 210, 215, and 220 that are correlated (e.g., a record, etc.). Frequency detection information is illustrated in tabular form merely for the sake of description. In this regard, frequency detection information may be implemented in a data structure different from a table.

Device state field 210 may store data indicating a state of wireless device 100 pertaining to a connection or disconnection with external antenna 140. For example, device state field 210 may indicate a state when a type of antenna assembly, such as an antenna or an antenna with a connecting element, as previously described, is connected to wireless device 100 via external antenna RF connector terminal 150. According to some exemplary implementations, device state field 210 may store other types of information, such as the type of antenna, the type of connecting element (e.g., coaxial cable, a wire, etc.), the length of the connecting element (e.g., 3 feet, etc.), and/or another feature pertaining to the antenna assembly. One entry 201 of device state field 210 may store data indicating a state when no antenna assembly is connected. Additionally, for example, one or multiple entries 201 of device state field 210 may store other types of states pertaining to external antenna 140 or the antenna assembly, such as a cable with damaged insulation, shield damage or corroded, crimped cable, a damaged external antenna (e.g., that results in change of capacitance as part of the antenna system, etc.), a damaged connecting element, a loose connection with external antenna 140, or other condition (e.g., open cable, a shorted cable, etc.). In some instances, a damaged antenna or another type of defective connection may yield a frequency of zero or some other value within an expected frequency range.

Frequency field 215 may store data indicating a frequency or a frequency range that correlates to the device state indicated in device state field 210. For example, frequency field 215 may store one or multiple values that can be used for comparison by controller 170 relative a measured output frequency of detector 125. According to some exemplary implementations, the frequency or the frequency range may correspond to a difference frequency relative to an open circuit frequency. For example, the open circuit frequency may be a frequency when wireless device 100 is not connected to any reactive load except for a reactive load associated with circuit parasitics. According to other exemplary implementations, the frequency or the frequency range may not correspond to a difference frequency.

Procedure field 220 may store data indicating an action that is permitted when it is determined that wireless device 100 is in a given state. For example, procedure field 220 may store data indicating to transmit data via external antenna 140 when it is determined that wireless device 100 is connected to external antenna 140, and may store data indicating not to transmit data via external antenna 140 when it is determined that wireless device 100 is not connected to external antenna 140. According to other exemplary implementations, procedure field 220 may store indicating other types of actions to take based on a given state of wireless device 100. For example, when it is determined that external antenna 140 is damaged or a loose connection exists, procedure field 220 may store data indicating to transmit, via internal antenna 160 and to a backend system (e.g., of the utility company) or another device (e.g., a mobile device associated with a customer, etc.), data (e.g., an error message, etc.) indicating the condition of external antenna 140. In this way, a utility company, the customer, and/or another interested party may be informed of the issue, and corrective measures may be initiated.

According to other exemplary implementations, table 200 may store additional, fewer, and/or different instances of information in support of the antenna assembly detection service, as described herein. For example, according to other exemplary implementations, table 200 may not store procedure field 220.

Figure 3:
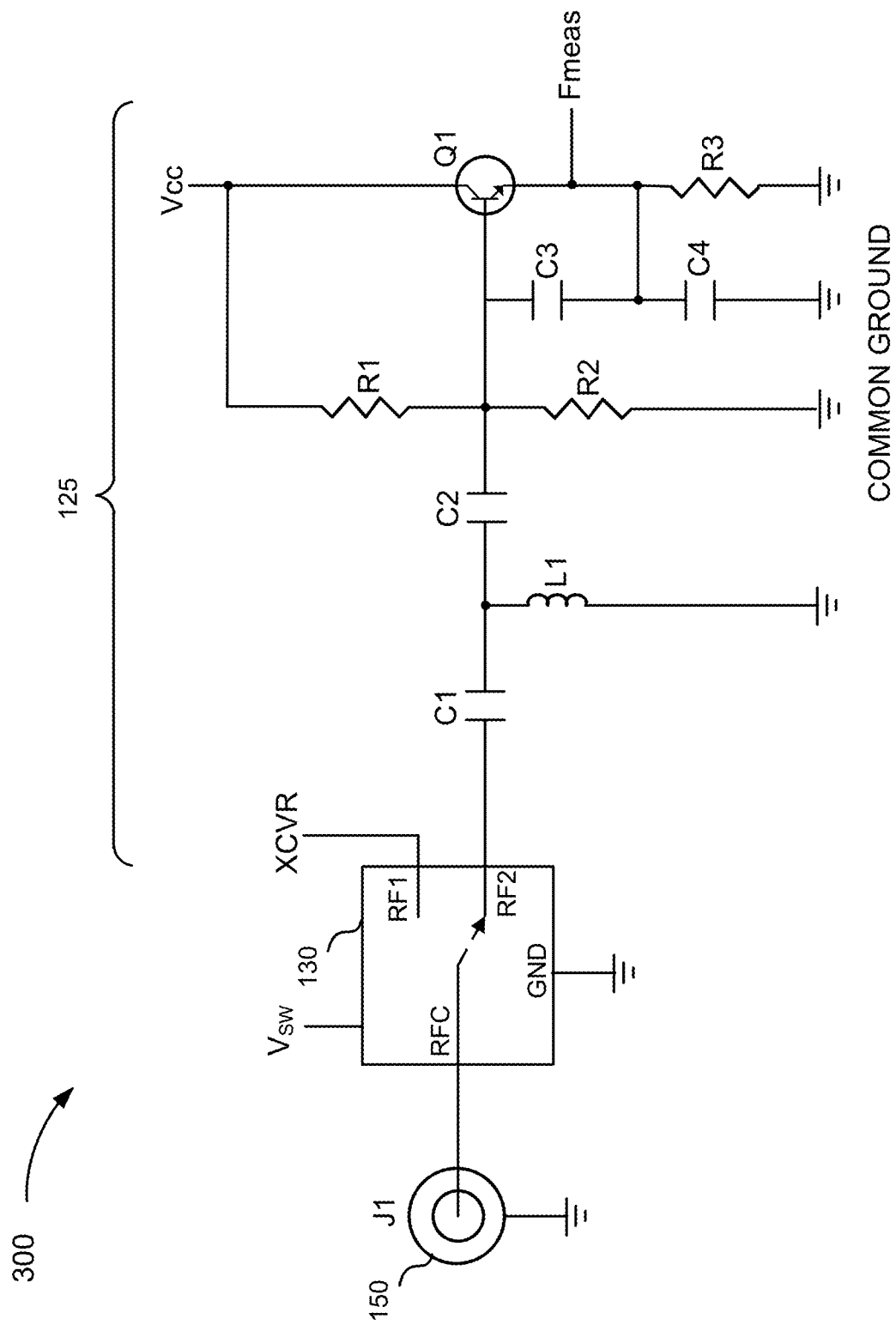
FIG. 3 is a diagram illustrating an exemplary oscillator circuit of an exemplary embodiment of the antenna assembly detection service.

FIG. 3 is a diagram illustrating an exemplary portion 300 of wireless device 100 that provides an exemplary embodiment of the antenna assembly detection service. As illustrated, detector 125 may include a circuit that includes various circuit elements, such as a capacitor, a resistor, an inductor, and a transistor. The circuit includes an LC oscillator whose frequency of operation may be determined by the resonant frequency of its tank circuit and the reactance of the load on external antenna RF connector terminal 150. According to this example, the tank circuit may include L1, C2, C3, and C4. The tank circuit may be connected to switch 130 via C1. C1 may be of low-impedance such that it may not appreciably affect the resonant frequency of the tank circuit while still providing DC blocking. The oscillator may be biased via R1, R2, and R3. R1, R2, and R3 may have values that trade off the widest range of acceptable load conditions, DC current draw, and oscillator stability over operating conditions. The oscillator may be powered by applying an appropriate voltage between Vcc and ground. According to an exemplary embodiment, the oscillator is powered on only when the state of wireless device 100 is being assessed, so as to save battery energy.

The application of voltage between Vsw and ground connects the oscillator's tank circuit to external antenna RF connector terminal 150 and the load. After the oscillator stabilizes, the output frequency of the circuit, which is dependent on the reactance of the load, may be measured at Fmeas. If the load is inductive, the inductance will combine with L1 to lower the effective inductance of the tank circuit, thereby increasing the operating frequency. If the load is capacitive, that capacitance will combine with the other capacitors of the tank circuit to increase the overall effective capacitance of the tank circuit, thereby decreasing the operating frequency.

As previously described, detector 125 may be implemented with various types of oscillator circuits. However, depending on the type of oscillator circuit implemented to provide the antenna assembly detection service, a circuit element (e.g., an inductor, etc.) may yield use of a non-standard value of the circuit element, which may contribute to cost and/or availability. In contrast, other types of oscillator circuits, as described herein, may be implemented to provide the antenna assembly detection service, with use of a standard value associated with the circuit element, which may minimize cost and increase availability relative to the same circuit element having a non-standard value. In either case, the tank circuit may be configured to satisfy one or multiple criteria. For example, the tank circuit may oscillate within a frequency band where the Barkhousen criteria may be satisfied over an expected operating range, taking into account the frequency-dependent gain and the expected effective series RF resistance of the expected antenna assembly (e.g., external antenna 140). Additionally, for example, the tank circuit may oscillate within a frequency band where an expected antenna assembly would perturb the resonant frequency of the tank circuit from its nominal resonant frequency. This may or may not be in the same frequency band as the resonant frequency of the expected antenna assembly loads. Also, for example, the tank circuit may have an acceptable nominal resonant frequency, such that there is a significant difference between the state/condition when external antenna 140 is connected and when external antenna 140 is not connected. Further, for example, the tank circuit may output a frequency or within a frequency band that is measurable (e.g., by controller 170). Additionally, for example, the output of the oscillator circuit may be in a frequency band that minimizes spurious radiation.

According to an exemplary embodiment, the oscillator circuit may operate in the 2-15 MHz portion of the high frequency (HF) band. According to other exemplary embodiments, the oscillator circuit may operate within a different frequency range.

According to some exemplary embodiments, the antenna assembly detection service may include a normalization process. For example, in order to compensate for variations in oscillator frequency due to temperature, supply voltage, or process variations, a frequency normalizing process may be performed. For example, referring to FIG. 3, with switch 130 open (e.g., connected to the XCVR), controller 170 (and software) may measure the open-circuit frequency of the oscillator. The open circuit frequency may be subtracted from, or otherwise used to normalize the frequency of the oscillator circuit when the reactive load is connected (e.g., with switch 130 connected to the oscillator circuit of detector 125). In this regard, the normalization process may normalize the reactive load oscillator frequency measurement and associated frequency variation when circuit parameter variation may be present. In this regard, the antenna assembly detection service may identify the state of wireless device 100 in relation to external antenna 140 based on the actual oscillator frequency or a normalized oscillator frequency of a particular load. Controller 170 may have access to the open circuit frequency for use in calculations. The normalization process may yield a difference frequency (e.g., positive or negative) indicative of a type of antenna assembly that is connected, etc.

According to some exemplary embodiments, the antenna assembly detection service may include a signal-conditioning process. For example, the signal-conditioning process may be needed to interface the voltage levels and rise and fall times of the oscillator to that required to enable measurement by controller 170 or other logic (e.g., a timer and counter circuit, etc.). For example, a sine-to-square slicing circuit may be used.

Figure 4:
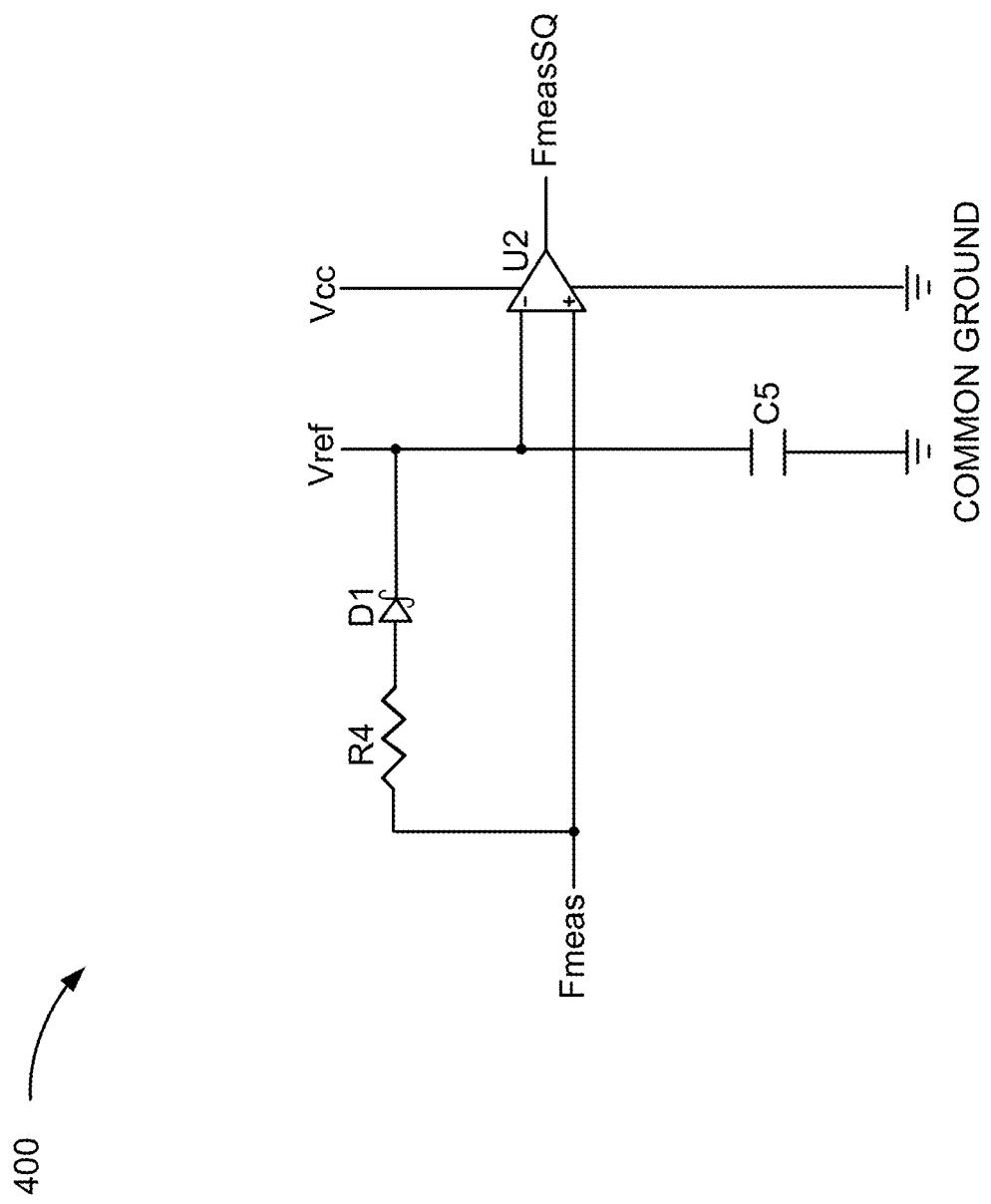
FIG. 4 is a diagram illustrating an exemplary signal-conditioning circuit of an exemplary embodiment of the antenna assembly detection service.

FIG. 4 is a diagram illustrating an exemplary signal-conditioning circuit 400. As illustrated, the signal Fmeas from the oscillator circuit of FIG. 3, may be half-wave rectified by D1, and filtered by R4 and C5 combination, which may produce a reference voltage Vref. Vref may be a reference voltage that is close to the average value of the oscillator's output signal. The time constant of R4 and C5 may be chosen to be longer than the period of the lowest expected frequency of Fmeas. For example, the time constant may be about ten times or more than the period of the lowest expected frequency of Fmeas. A comparator or operational amplifier U2 may run in an open-loop comparison mode, which outputs a voltage if the voltage of the Fmeas signal is above Vref, or if the voltage of the Fmeas signal is below Vref. In this way, the Fmeas signal may be converted to, for example, a square wave, with a fast rise/fall time that is compatible with a measuring counter, and output at FmeasSQ.

According to various exemplary embodiments, the antenna assembly detection service may be invoked according to various triggering events. According to an exemplary implementation, the antenna assembly detection service may be invoked just prior to data needing to be transmitted via external antenna 140. For example, the data transmission may be according to a schedule or not. According to another exemplary implementation, the antenna assembly detection service may be invoked periodically (e.g., about once/hour or another configured periodicity) subsequent to installation of wireless device 100 (e.g., an MIU, etc.). According to still other exemplary implementations, the antenna assembly detection service may be invoked based on receipt of a message (e.g., via internal antenna 160) to perform a diagnostic procedure. For example, a technician via a mobile device or a backend system of a meter network may transmit a message to wireless device 100 to invoke the antenna assembly detection service. In some instances, the backend system may automatically transmit the message based on certain weather conditions (e.g., extreme temperatures, winds, etc.) that have the potential to damage external antenna 140. According to yet another example, based on the time of year (e.g., summer versus fall, etc.), the antenna assembly detection service may be invoked more or less frequently. For example, during the summer time, potential damage to external antenna 140 may increase due to landscaping activities (e.g., mowing the lawn, etc.).

According to some exemplary embodiments, the invocation of the antenna assembly detection service may cause switch to connect detector 125 to external antenna RF connector terminal 150. According to some exemplary embodiments, controller 170 may control switch 130 to make or not make such a connection.

Figure 5:
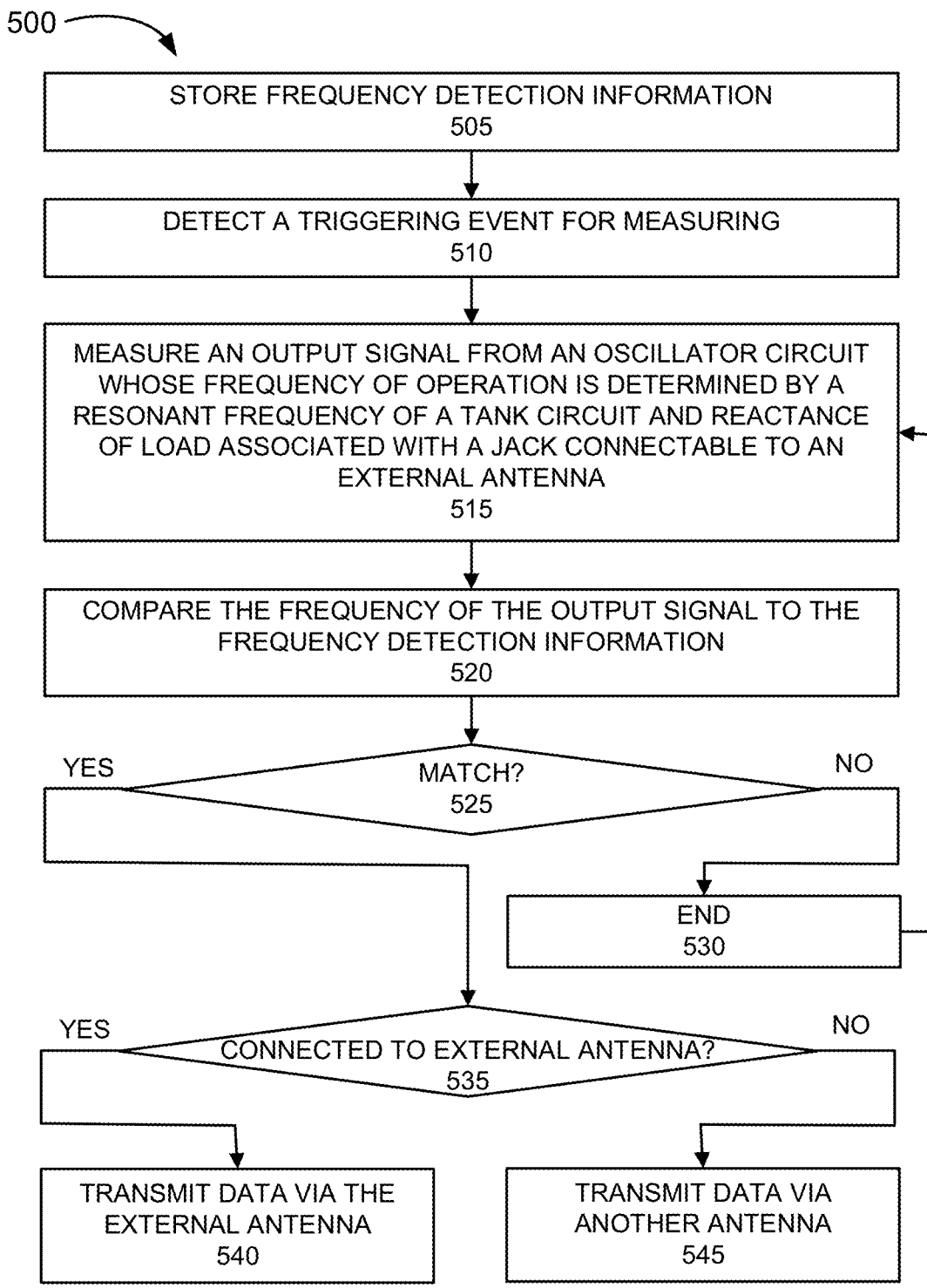
FIG. 5 is a diagram illustrating an exemplary process of an exemplary embodiment of the antenna assembly detection service.

FIG. 5 is a flow diagram illustrating an exemplary process 500 of an exemplary embodiment of the antenna assembly detection service. According to an exemplary embodiment, wireless device 100 may perform, in whole or in part, steps of process 500. According to an exemplary implementation, controller 170 may execute software to perform a step illustrated in FIG. 5, and described herein. Alternatively, a step illustrated in FIG. 5, and described herein, may be performed by execution of only hardware.

Referring to FIG. 5, in block 505, frequency detection information may be stored. For example, wireless device 100 stores expected frequencies and/or frequency bands that are correlated to various states of wireless device 100 in relation to external antenna 140, such as connected, not connected, partially connected, and damaged, in table 200.

In block 510, a triggering event for measuring is detected. For example, wireless device 100 may be triggered to measure the output voltage of detector 125. By way of further examples, the triggering event may include the occurrence of a schedule, data to transmit, or receipt of a message.

In block 515, an output signal from an oscillator circuit whose frequency of operation is determined by a resonant frequency of a tank circuit and reactance of a load associated with a jack connectable to an external antenna may be measured. For example, wireless device 100 may measure the output of detector 125. The measured output may correspond to an oscillation frequency, as previously described.

In block 520, the frequency of the output signal may be compared to the frequency detection information. For example, wireless device 100 may perform a lookup to determine if the measured output signal of detector 125 matches one of the frequency fields 215 of entries 201.

In block 525, it may be determined whether a match exists. For example, wireless device 100 may determine whether a match exists based on a result of the comparison.

When it is determined that a match does not exist (block 525—NO), process 500 may end (block 530). According to various exemplary implementations, wireless device 100 may perform different operations when a match does not exist. For example, wireless device 100 may transmit an error message, which indicates an unknown state of external antenna 140, via internal antenna 160 to a backend system. Additionally, or alternatively, wireless device 100 may select a default state for wireless device 100 (e.g., connected, not connected, damaged, etc.). Alternatively, process 500 may return to block 515, and wireless device 100 may re-measure the output of detector 125. According to other exemplary embodiments, block 525—NO may not occur because all conditions would be mapped. In this regard, this step may be omitted.

When it is determined that a match does exist (block 525—YES), it may be determined whether an external antenna is connected (block 535). For example, wireless device 100 may identify the correlated device state (e.g., device state field 210) based on the matching frequency (e.g., frequency field 215). The device state may indicate whether external antenna 140 is connected or not, or some other state, as previously described.

When it is determined that the external antenna is connected (block 535—YES), data may be transmitted via the external antenna (block 540). For example, wireless device 100 may transmit data via external antenna 140. According to other examples, wireless device 100 may check the state, and not transmit data.

When it is determined that the external antenna is not connected (block 535—NO), data may be transmitted via another antenna (block 545). For example, wireless device 100 may transmit data via internal antenna 160. According to other examples, wireless device 100 may check the state, and not transmit data.

FIG. 5 illustrates an exemplary process 500 of the antenna assembly detection service, however, according to other embodiments, process 500 may include additional operations, fewer operations, and/or different operations than those illustrated in FIG. 5, and described herein. For example, process 500 may include a normalization process and/or signal conditioning process, as previously described, as a part of the measurement process in block 515.

The antenna detection techniques described herein may be performed in conjunction with other antenna detection techniques, such as the antenna detection techniques, using noise measurements, described in U.S. application Ser. No. 16/832,539 (corresponding to U.S. Provisional Application No. 62/828,105), and/or the antenna detection techniques, using forward and reflected power measurements, described in U.S. application Ser. No. 16/832,483 (corresponding to U.S. Provisional Application No. 62/835,669). U.S. application Ser. No. 16/832,483 and U.S. application Ser. No. 16/832,539 are incorporated by reference herein in their entireties. The antenna detection techniques described herein, and the antenna detection techniques described in U.S. application Ser. No. 16/832,483 and U.S. application Ser. No. 16/832,539 may be selectively used relative to one another, may be performed in series, or may be performed in parallel, to detect the presence or absence of an antenna connected or coupled to a port or antenna connector terminal of wireless device 100, such as a Meter Interface Unit (MIU). For example, wireless device 100 may execute the exemplary process of FIGS. 7A and 7B, or FIG. 9, of U.S. application Ser. No. 16/832,483 in parallel with the exemplary process of FIG. 5 of the present application (that corresponds to U.S. Provisional Application No. 62/825,885) and/or the exemplary process of FIG. 6 of U.S. application Ser. No. 16/832,539. As another example, wireless device 100 may selectively execute one of: 1) the exemplary process of FIG. 5 of the present application the exemplary process of FIGS. 7A and 7B or FIG. 9 of U.S. application Ser. No. 16/832,483; or 3) the exemplary process of FIG. 6 of U.S. application Ser. No. 16/832,539 based on certain criteria.

As set forth in this description and illustrated by the drawings, reference is made to "an exemplary embodiment," "an embodiment," "embodiments," etc., which may include a particular feature, structure or characteristic in connection with an embodiment(s). However, the use of the phrase or term "an embodiment," "embodiments," etc., in various places in the specification does not necessarily refer to all embodiments described, nor does it necessarily refer to the same embodiment, nor are separate or alternative embodiments necessarily mutually exclusive of other embodiment(s). The same applies to the term "implementation," "implementations," etc.

The foregoing description of embodiments provides illustration, but is not intended to be exhaustive or to limit the embodiments to the precise form disclosed. Accordingly, modifications to the embodiments described herein may be possible. For example, various modifications and changes may be made thereto, and additional embodiments may be implemented, without departing from the broader scope of the invention as set forth in the claims that follow. The description and drawings are accordingly to be regarded as illustrative rather than restrictive.

According to some exemplary embodiments, the antenna assembly detection service may be used in combination (e.g., parallel, in series) with other antenna detection approaches. For example, reference is made to pending provisional patent applications that describe antenna detection based on noise measurement and return loss (e.g., reflected power and forward power).

The terms "a," "an," and "the" are intended to be interpreted to include one or more items. Further, the phrase "based on" is intended to be interpreted as "based, at least in part, on," unless explicitly stated otherwise. The term "and/or" is intended to be interpreted to include any and all combinations of one or more of the associated items. The word "exemplary" is used herein to mean "serving as an example." Any embodiment or implementation described as "exemplary" is not necessarily to be construed as preferred or advantageous over other embodiments or implementations.

Embodiments described herein may be implemented in many different forms of software executed by hardware. For example, a process or a function may be implemented as "logic," a "component," or an "element." The logic, the component, or the element, may include, for example, hardware (e.g., controller 170, etc.), or a combination of hardware and software.

Embodiments have been described without reference to the specific software code because the software code can be designed to implement the embodiments based on the description herein and commercially available software design environments and/or languages. For example, various types of programming languages including, for example, a compiled language, an interpreted language, a declarative language, or a procedural language may be implemented.

Use of ordinal terms such as "first," "second," "third," etc., in the claims to modify a claim element does not by itself connote any priority, precedence, or order of one claim element over another, the temporal order in which acts of a method are performed, the temporal order in which instructions executed by a device are performed, etc., but are used merely as labels to distinguish one claim element having a certain name from another element having a same name (but for use of the ordinal term) to distinguish the claim elements.

The terms "about" and "approximately" shall generally mean an acceptable degree of error or variation for the quantity measured given the nature or precision of the measurements. Typical, exemplary degrees of error or variation are within 20 percent (%), preferably within 10%, and more preferably within 5% of a given value or range of values. Numerical quantities given in this description are approximate unless stated otherwise, meaning that the term "about" or "approximately" can be inferred when not expressly stated.

Additionally, embodiments described herein may be implemented as a non-transitory computer-readable storage medium that stores data and/or information, such as instructions, program code, a data structure, a program module, an application, a script, or other known or conventional form suitable for use in a computing environment. The program code, instructions, application, etc., is readable and executable by a processor (e.g., controller 170) of a device.

No element, act, or instruction set forth in this description should be construed as critical or essential to the embodiments described herein unless explicitly indicated as such.

All structural and functional equivalents to the elements of the various aspects set forth in this disclosure that are known or later come to be known to those of ordinary skill in the art are expressly incorporated herein by reference and are intended to be encompassed by the claims. No claim element of a claim is to be interpreted under 35 U.S.C. § 112(f) unless the claim element expressly includes the phrase "means for" or "step for."

What is claimed is:

1. A device comprising:
a memory that stores comparison data;
a radio frequency (RF) communication interface;
an antenna terminal configured to connect to an external antenna;
an oscillator circuit whose frequency of operation is determined by a resonant frequency of a tank circuit and reactance of a load associated with the antenna terminal; and
a controller configured to:
measure an output signal of the oscillator circuit when the oscillator circuit is connected to the antenna terminal;
normalize a frequency of the output signal based on an open-circuit frequency of the oscillator circuit; and
determine whether or not the external antenna is connected to the antenna terminal based on the measurement and the comparison data, wherein the device is a meter interface unit.

2. The device of claim 1, wherein the comparison data includes a first frequency value indicating that the external antenna is connected to the antenna terminal, and a second frequency value indicating that the external antenna is not connected to the antenna terminal.

3. The device of claim 1, wherein the oscillator circuit includes an inductor capacitor (LC) oscillator.

4. The device of claim 1, wherein the external antenna includes an intermediary connector.

5. The device of claim 1, wherein the controller is further configured to:
transmit data, via an internal antenna of the device, in response to a determination that the external antenna is not connected to the antenna terminal.

6. The device of claim 1, wherein the comparison data includes frequency values pertaining to different types of external antennas.

7. The device of claim 1, further comprising:
an internal antenna; and
a switch, wherein the switch can selectively switch between a first connection with the oscillator circuit and the antenna terminal and a second connection with the RF communication interface and the antenna terminal.

8. The device of claim 1, wherein the controller is further configured to:
detect a triggering event; and
measure the output signal in response to the detection of the triggering event.

9. The device of claim 1, wherein the comparison data includes a frequency value indicating that the external antenna is connected to the antenna terminal but is damaged.

10. The device of claim 1, wherein the controller is further configured to:
transmit data, via the radio communication interface and the external antenna, in response to a determination that the external antenna is connected to the antenna terminal.

11. A non-transitory computer-readable storage medium storing instructions executable by a processor of a device, which when executed cause the device to:
measure an output signal of an oscillator circuit when the oscillator circuit is connected to an antenna terminal, wherein the oscillator circuit has a frequency of operation determined by a resonant frequency of a tank circuit and reactance of a load associated with the antenna terminal, and wherein the antenna terminal is configured to connect to an external antenna;
normalize a frequency of the output signal based on an open-circuit frequency of the oscillator circuit; and
determine whether or not the external antenna is connected to the antenna terminal based on the measurement and stored comparison data, wherein the device is a meter interface unit.

12. The non-transitory computer-readable storage medium of claim 11, wherein the comparison data includes a first frequency value indicating that the external antenna is connected to the antenna terminal, and a second frequency value indicating that the external antenna is not connected to the antenna terminal.

13. The non-transitory, computer-readable storage medium of claim 11, wherein the instructions further comprise instructions, which when executed cause the device to:
transmit data, via a radio communication interface of the device and the external antenna, in response to a determination that the external antenna is connected to the antenna terminal.

14. The non-transitory computer-readable storage medium of claim 11, wherein the external antenna includes an intermediary connector.

15. The non-transitory, computer-readable storage medium of claim 11, wherein the instructions further comprise instructions, which when executed cause the device to:
transmit data, via an internal antenna of the device, in response to a determination that the external antenna is not connected to the antenna terminal.

16. A method comprising:
measuring, by a device, an output signal of an oscillator circuit of the device when the oscillator circuit is connected to an antenna terminal of the device, wherein the oscillator circuit has a frequency of operation determined by a resonant frequency of a tank circuit and reactance of a load associated with the antenna terminal, and wherein the antenna terminal is configured to connect to an external antenna;
normalizing, by the device, a frequency of the output signal based on an open-circuit frequency of the oscillator circuit; and
determining, by the device, whether or not the external antenna is connected to the antenna terminal based on the measurement and stored comparison data, wherein the device is a meter interface unit.

17. The method of claim 16, wherein the data includes a first frequency value indicating that the external antenna is connected to the antenna terminal, and a second frequency value indicating that the external antenna is not connected to the antenna terminal.

18. The method of claim 16, further comprising:
transmitting, via a radio communication interface of the device and the external antenna, data in response to determining that the external antenna is connected to the antenna terminal.

19. The method of claim 16, wherein the external antenna includes an intermediary connector.

20. The method of claim 16, further comprising:
   transmitting data, via an internal antenna, in response to determining that the external antenna is not connected to the antenna terminal.

<div style="text-align:center">* * * * *</div>